United States Patent
Rubinsztain et al.

(10) Patent No.: US 11,892,524 B1
(45) Date of Patent: Feb. 6, 2024

(54) REDUCED AREA MAGNETIC FIELD SENSOR TOPOLOGY

(71) Applicant: Allegro MicroSystems, LLC, Manchester, NH (US)

(72) Inventors: Ezequiel Rubinsztain, Buenos Aires (AR); Octavio H. Alpago, Ciudad de Buenos Aires (AR); Franco Noel Martin Pirchio, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 18/046,203

(22) Filed: Oct. 13, 2022

(51) Int. Cl.
*G01R 33/00* (2006.01)
*G01R 33/07* (2006.01)

(52) U.S. Cl.
CPC ..... *G01R 33/0058* (2013.01); *G01R 33/0041* (2013.01); *G01R 33/077* (2013.01)

(58) Field of Classification Search
CPC ............... G01R 33/00; G01R 33/0023; G01R 33/0041; G01R 33/0058; G01R 33/02; G01R 33/06; G01R 33/07; G01R 33/077; G01D 5/12; G01D 5/14; G01D 5/142–147; G01D 5/16
See application file for complete search history.

(56) References Cited

U.S. PATENT DOCUMENTS

| | | | |
|---|---|---|---|
| 3,995,174 A * | 11/1976 | Zrudsky | H03K 17/687 363/124 |
| 4,881,161 A * | 11/1989 | Thompson | G05B 19/40 700/63 |
| 5,517,112 A | 5/1996 | Vig et al. | |
| 6,356,741 B1 | 3/2002 | Bilotti et al. | |
| 6,622,012 B2 | 9/2003 | Bilotti et al. | |
| 7,085,119 B2 | 8/2006 | Bilotti et al. | |
| 7,307,824 B2 | 12/2007 | Bilotti et al. | |
| 7,990,209 B2 | 8/2011 | Romero | |
| 10,444,299 B2 * | 10/2019 | Romero | H03H 17/0219 |
| 11,029,370 B1 * | 6/2021 | Zimmermann | G01R 33/072 |
| 11,152,938 B2 | 10/2021 | Judkins, III et al. | |
| 2011/0248660 A1 * | 10/2011 | Lopez-Diaz | H02P 6/18 318/490 |

(Continued)

*Primary Examiner* — Giovanni Astacio-Oquendo
*Assistant Examiner* — David B Frederiksen
(74) *Attorney, Agent, or Firm* — Daly, Crowley, Mofford & Durkee, LLP

(57) ABSTRACT

A magnetic field sensor includes a magnetic field sensing element to generate a magnetic field signal indicative of a sensed magnetic field, a modulator to modulate the magnetic field signal at a chopping frequency, a front end amplifier coupled to receive the magnetic field signal and generate an amplified signal, and a demodulator configured to demodulate the amplified signal at the chopping frequency. The sensor further includes a low pass filter to process the amplified signal and generate a low pass filtered signal and a Schmitt trigger circuit. The Schmitt trigger circuit includes a comparator having a first input coupled to receive the low pass filtered signal, a second input coupled to receive a reference signal, and an output at which a comparator output signal is provided. The comparator is configured to perform a plurality of comparisons within a chopping time period that is the inverse of the chopping frequency.

19 Claims, 7 Drawing Sheets

(56) References Cited

U.S. PATENT DOCUMENTS

2012/0218018 A1* 8/2012 Petrie .................. G01R 33/075
                                                        327/187
2018/0224509 A1* 8/2018 Zhou ..................... H10N 50/10
2019/0391212 A1* 12/2019 Rubinsztain ....... G01R 33/0029

* cited by examiner

REDUCED AREA MAGNETIC FIELD SENSOR TOPOLOGY

FIELD

The present disclosure relates generally to sensors and more particularly to magnetic field sensors having reduced circuit area.

BACKGROUND

As is known, sensors are used to perform various functions. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Magnetic field sensors, which use magnetic field sensing elements, are used in a variety of applications, including, but not limited to, current sensors that sense magnetic fields generated by currents in a conductor, magnetic latches or switches, proximity detectors that sense the proximity of ferromagnetic or magnetic objects, rotation detectors that sense passing ferromagnetic articles such as gear teeth, and magnetic field density sensors.

Magnetic field sensors are often provided in the form of integrated circuits including a semiconductor or other substrate supporting electronic elements and traces and passive components. Circuit area is an important specification and can impact the cost of a magnetic field sensor integrated circuits.

Some magnetic field sensing elements, such as Hall Effect elements, exhibit an undesirable DC offset voltage. Techniques have been developed to reduce the DC offset voltage while still allowing the Hall Effect element to sense a DC magnetic field. One such technique is commonly referred to as "chopping" or "current spinning" and entails driving a Hall Effect element in two or more different directions during different portions (e.g., phases) of a clock cycle and receiving output signals at different output terminals of the Hall Effect element during the different portions of the clock cycle. In this way, drive, or power terminals and output terminals are interchanged during each phase of a chopping period and offset voltages of the different driving arrangements tend to cancel.

SUMMARY

The present disclosure provides a magnetic field sensor topology that results in smaller circuit area than heretofore possible. The sensor topology eliminates a sinc filter heretofore used as a mechanism to sample and average a processed magnetic field signal and instead utilizes a high speed comparator to compare a processed magnetic field signal to a reference signal multiple times during a chopping period in order to thereby provide the sensor output signal. Comparison can be implemented in a manner that reduces or eliminates sampling jitter.

According to the disclosure, a magnetic field sensor includes a magnetic field sensing elements configured to generate a magnetic field signal indicative of a sensed magnetic field, a modulator configured to modulate the magnetic field signal at a chopping frequency, a front end amplifier coupled to receive the magnetic field signal and generate an amplified signal, a demodulator configured to demodulate the amplified signal at the chopping frequency, a low pass filter configured to process the amplified signal and generate a low pass filtered signal, and a Schmitt trigger circuit. The Schmitt trigger circuit includes a comparator having a first input coupled to receive the low pass filtered signal, a second input coupled to receive a reference signal, and an output at which a comparator output signal is provided, with the comparator configured to perform a plurality of comparisons within a chopping time period that is the inverse of the chopping frequency.

Features may include one or more of the following individually or in combination with other features. The Schmitt trigger circuit has an output at which samples of the comparator output signal are latched, wherein each sample of the comparator output signal corresponds to a comparison performed by the comparator. In some embodiments, the Schmitt trigger circuit includes a latch having an input coupled to the output of the comparator, a control input, and an output at which the samples of the comparator output signal are provided. In some embodiments, the comparator includes a latch configured to provide the samples of the comparator output signal. The comparator can include a pre-amplifier coupled to receive the low pass filtered signal. The magnetic field sensor can further include a shift register configured to store a plurality of samples of the comparator output signal and a controller coupled to the shift register and configured to determine whether the stored samples of the comparator output signal exceed the reference signal and generate an output of the magnetic field sensor based on the determination. In some embodiments, the controller is configured to accumulate values of the stored samples of the comparator output signal to determine an accumulated value and generate the magnetic field sensor output signal based on a most significant bit of the accumulated value. And in some embodiments, the controller is configured to continuously determine a summation of values of the stored samples of the comparator output signal and generate the magnetic field sensor output signal based on a most significant bit of the summation. The plurality of comparisons can include at least eight comparisons. The reference signal can have a level based on a state of the comparator output signal. The magnetic field sensor can further include a digital-to-analog converter (DAC) coupled to a variable resistor and configured to generate the reference signal.

Also described is a method for processing a magnetic field signal with a magnetic field sensor including generating, with a magnetic field sensing element, a magnetic field signal in response to a magnetic field, modulating the magnetic field signal at a chopping frequency, amplifying, with a front end amplifier, the magnetic field signal to generate an amplified signal, demodulating the amplified signal at the chopping frequency, filtering the amplified signal with a low pass filter to generate a low pass filtered signal, and comparing, with a Schmitt trigger circuit, the low pass filtered signal to a reference signal a plurality of times within a chopping time period that is the inverse of the chopping frequency to generate a comparison signal.

Features may include one or more of the following individually or in combination with other features. The method may further include latching samples of the comparison signal. In some embodiments, the method may further include accumulating values of the latched samples of the comparison signal to generate an accumulated value and providing an output signal of the magnetic field sensor based on a most significant bit of the accumulated value. In some embodiments, the method may further include continuously summing values of the latched samples and providing an output signal of the magnetic field sensor based on a most significant bit of the summation. The method may further include generating the reference signal based on a state of the comparison signal.

Also described is a magnetic field sensor including a magnetic field sensing elements configured to generate a magnetic field signal indicative of a sensed magnetic field, a modulator configured to modulate the magnetic field signal at a chopping frequency, a front end amplifier coupled to receive the magnetic field signal and generate an amplified signal, a demodulator configured to demodulate the amplified signal at the chopping frequency, a low pass filter configured to process the amplified signal and generate a low pass filtered signal, and means for performing a plurality of comparisons of the low pass filtered signal with a reference signal during a chopping time period that is the inverse of the chopping frequency.

Features may include one or more of the following individually or in combination with other features. The magnetic field sensor can further include means for generating an output signal of the magnetic field sensor based on the comparisons. The magnetic field sensor can further include means for generating the reference signal based on a state of the output signal.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
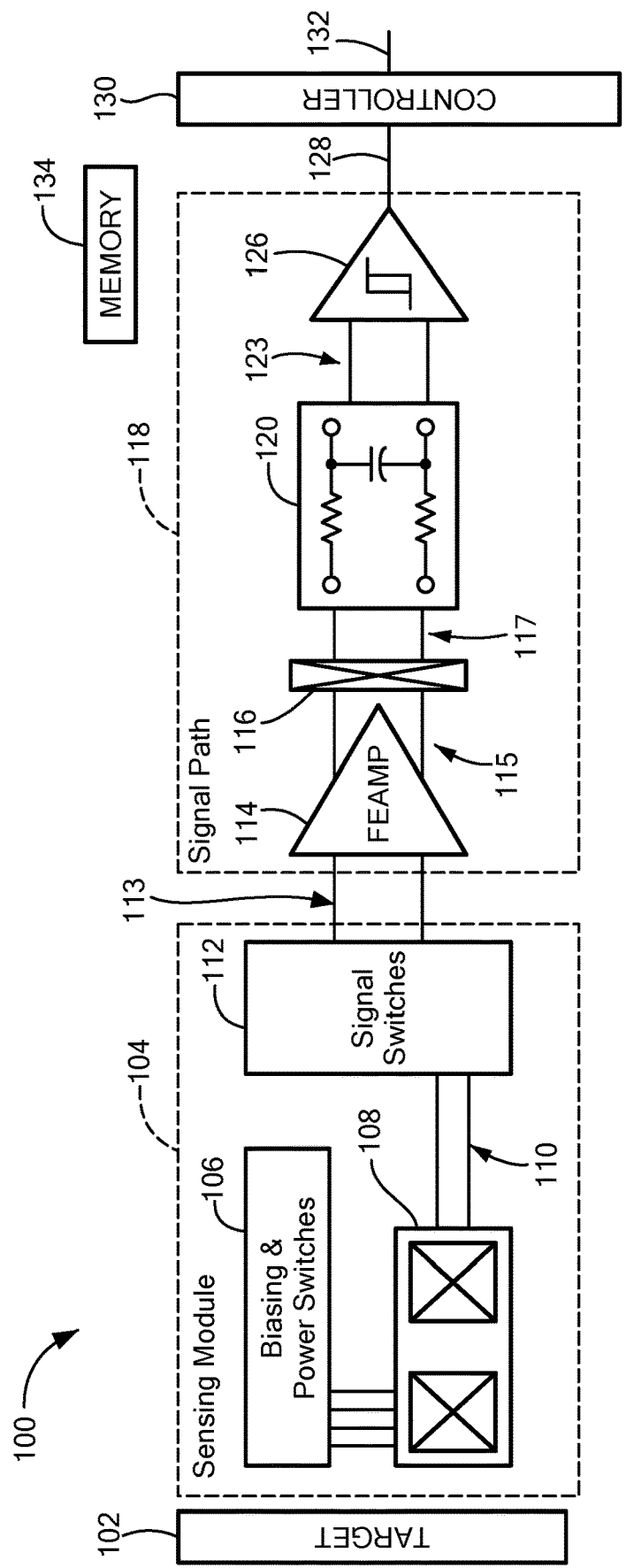
FIG. 1 is a block diagram of a sensor that includes a high speed comparator, according to the present disclosure.

Referring to FIG. 1, a sensor 100 includes a sensing module 104 and a signal path 118, according to the present disclosure. The sensor 100 may take various forms to sense various parameters, such as a magnetic field sensor to sense a magnetic field, in which case the sensing module 104 includes one or more magnetic field sensing elements 108 configured to generate a magnetic field signal 110 indicative of a sensed magnetic field.

Sensing module 104 further includes biasing and power switches 106 that bias the magnetic field sensing element 108 by applying a bias voltage or a bias current. Signal switches 112 operate to modulate the magnetic field signal 110 at a chopping frequency in order to thereby generate a modulated signal 113.

The signal path 118 includes a front end amplifier 114 and a Schmitt trigger circuit 126. Additional elements of the signal path 118 include demodulator 116 and a low pass filter 120. The front end amplifier 114 is coupled to receive the modulated signal 113 and generate an amplified signal 115. The demodulator 116 is configured to demodulate the amplified signal 115 at the chopping frequency. The low pass filter 120 is configured to process the amplified signal 115 and generate a low pass filtered signal 123 and the Schmitt trigger circuit 126 can include a comparator having a first input coupled to receive the low pass filtered signal 123, a second input coupled to receive a reference signal, and an output 128 at which a comparator output signal is provided. According to the disclosure, the comparator of the Schmitt trigger circuit 126 is configured to perform a plurality of comparisons within a chopping time period that is the inverse of the chopping frequency.

With this arrangement, sensor 100 has a topology that results in a relatively small circuit area by eliminating a sinc filter heretofore used as a mechanism to sample and average the processed magnetic field signal. Sensor 100 utilizes a high-speed comparator to generate a signal for comparison to a reference signal in order to thereby provide the sensor output signal. As will become apparent, by "high-speed", it is meant that the Schmitt trigger comparator is capable of operating faster than a chopping frequency. Comparison can be implemented in a manner that reduces or eliminates sampling jitter.

The term "magnetic field sensor" 100 or simply "sensor" is used herein to describe a circuit that includes one or more magnetic field sensing elements, generally in combination with other circuits. Magnetic field sensor 100 can be used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic target or object, a rotation detector (or movement detector) that senses passing articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field.

Sensor 100 is described herein in the context of a magnetic switch, or latch; however, it will be appreciated by those of ordinary skill in the art that the described signal path topology and associated methods are not limited to any particular type of sensor. For example, the described structures and methods can be used in rotation sensors, angle sensors, pressure sensors and temperature sensors to name a few.

The magnetic field sensing module 104 includes one or more magnetic field sensing elements 108 configured to generate a magnetic field signal 110 indicative of a sensed magnetic field. In embodiments including two or more magnetic field sensing elements, each element can be configured to generate a respective magnetic field signal. As used herein, the term "magnetic field signal" is used to describe any signal that results from a magnetic field experienced by a magnetic field sensing element.

The sensed magnetic field can be generated by and/or affected by a proximate target 102. Example target 102 can take the form of a ring magnet having magnetic domains or a ferromagnetic object (e.g., gear teeth) where a back-bias or other magnet generates the magnetic field that is affected by movement of the target.

The magnetic field sensing element 108 can be, but is not limited to, a Hall effect element, a magnetoresistance element, an inductive coil, or a magnetotransistor and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate or in the plane of the substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of maximum sensitivity perpendicular to a substrate, while metal based or metallic magnetoresistance elements (e.g., GMR, TMR, AMR) and vertical Hall elements tend to have axes of maximum sensitivity parallel to a substrate.

In an example, the magnetic field sensing element 108 includes two vertical Hall plates coupled to receive bias, or drive signals from the biasing module 106, as shown. While the sensing element 108 is shown as a dual Hall plate, it will be appreciated by those of ordinary skill in the art that each element may include only a single Hall plate or more than two Hall plates.

Sensing element 108 can implement chopping. To this end, terminals of the Hall plate 108 are interchanged by switches 112 under control of a chopping clock signal at a chopping frequency so that during subsequent chopping phases (e.g., Phase I and Phase II), bias terminals (i.e., drive terminals) and output terminals (i.e., signal contact terminals) of the Hall plate 108 are interchanged. In other words, selected drive and signal contact pairs are interchanged during each phase of the chopping and offset voltages of the different driving arrangements tend to cancel toward zero. Such modulation of the magnetic field signal 110 results in conversion of the sensed magnetic field to a relatively high chopping frequency without modulating any offset which thus, remains at DC. Example chopping frequencies can be on the order of 500 KHz.

Front end amplifier 114 is coupled to signal switches 112 to receive the chopped signal 113 and is configured to generate an amplified signal 115.

Demodulator 116 is coupled to receive the amplified signal 115 and perform demodulation at the chopping frequency. The resulting demodulated signal 117 has the magnetic field component converted to baseband and the amplified offset is modulated to the relatively high chopping frequency.

Low pass filter 120 is configured to process the demodulated signal 117 in order to remove the undesired offset at the chopping frequency without affecting the magnetic field signal. The result of filtering by low pass filter 120 is a filtered signal 123 including a DC signal summed to a remaining triangular offset signal.

Schmitt trigger circuit 126 includes a comparator having a first input coupled to receive the low pass filtered signal 123, a second input coupled to receive a reference signal, and an output 128 at which a comparator output signal is provided. As noted, according to the disclosure, the comparator of the Schmitt trigger circuit 126 is configured to perform a plurality of comparisons within a chopping time period that is the inverse of the chopping frequency.

In embodiments, the Schmitt trigger circuit 126 has an output at which samples of the comparator output signal 128 are latched, with each latched sample of the comparator output signal corresponding to a respective comparison performed by the comparator. Various latch configurations and schemes are possible as will be described.

It should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

A controller 130, as may be a digital controller can be coupled to an output of the Schmitt trigger circuit 126 and can generate a sensor output signal 132 based on the latched comparator output signal samples. Based on the plurality of comparisons during each chopping time period, a determination can be made as to how many of the samples are greater than the threshold and how many samples are less than the threshold signal (i.e., how many samples cause a logic high, or "1" comparator output and how many samples cause a logic low, or "0" comparator output).

The sensor output signal 132 can take various forms, such as a voltage signal in the case of a so-called three-wire output configuration as shown or a current signal in the case of a so-called two-wire output in which the output signal information is provided in the form of current pulses on the power and ground connections to the sensor. Also, it will be appreciated that various sensor output signal formats are possible. A memory 134 can be configured to store various data such as configuration parameters.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

Figure 2:
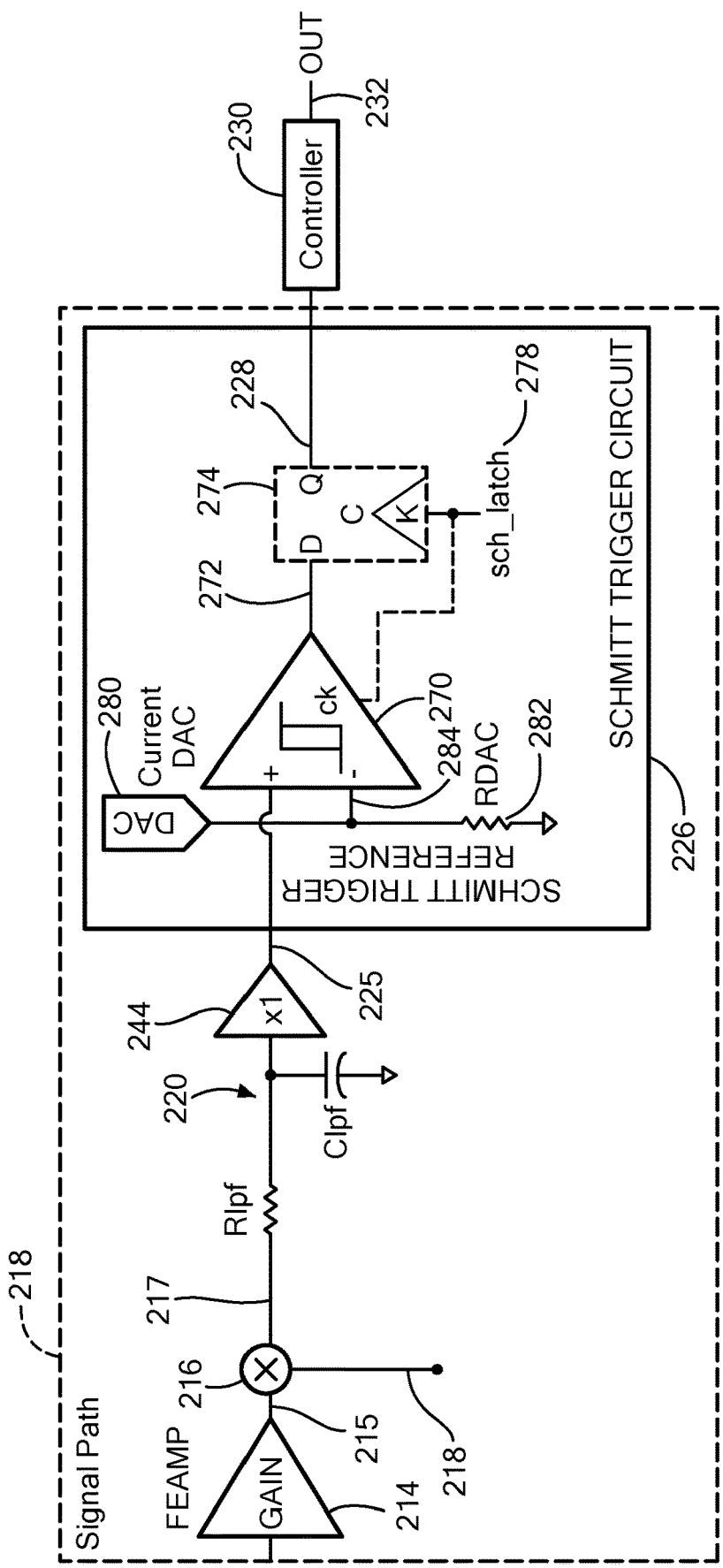
FIG. 2 is a simplified schematic of the sensor of FIG. 1.

Referring also to FIG. 2, a more detailed signal path 218 is shown. Signal path 218 can be the same as or similar to signal path 118 of FIG. 1. Accordingly, signal path 218 can include a front end amplifier 214, a demodulator 216, a low pass filter 220, and a Schmitt trigger circuit 226, each of which can be the same as or similar to elements 118, 114, 116, 120, and 126 of FIG. 1, respectively. Although the signal path 218 of FIG. 2 illustrates single-ended signals for simplicity, it will be appreciated that the same concepts can be applied to differential signals such as shown in FIG. 1.

The front end amplifier 214 is coupled to receive a modulated signal, for example modulated signal 113 from sensing element 108 of FIG. 1. Amplifier 214 applies a gain to the modulated signal to generate an amplified signal 215.

Demodulator 216 demodulates the amplified signal 215 according to a demodulation signal 218 that can be the same as or similar to the chopping clock signal by which the Hall plate sensing element 108 (FIG. 1) is chopped. The demodulation signal includes alternating first and second phases (e.g., Phases I when the demodulation signal is at +1 and Phases II when the demodulation signal is at −1) and has a chopping period that is the inverse of the chopping frequency. Operation of the demodulator 216 brings the signal indicative of the sensed magnetic field back to baseband and modulates any offset to the chopping frequency.

The demodulated signal 217 is coupled to the low pass filter 220. The low pass filter 220 includes a resistor R1$fp$ and a capacitor C1$pf$ coupled as shown and further coupled to a buffer amplifier 244. The output signal of buffer amplifier 244 provides a low pass filtered signal 225 for coupling to the Schmitt trigger circuit 226.

The Schmitt trigger circuit 226 can be the same as or similar to Schmitt trigger circuit 126 of FIG. 1 and thus, includes a comparator 270 having a first input coupled to receive the low pass filtered signal 225, a second input coupled to receive a reference, or threshold signal 284, and an output at which a comparator output signal 272 is provided.

The reference signal 284 can be provided at a node between a series-coupled current digital-to-analog converter (DAC) 280 and resistor 282. In other words, the reference signal 284 can be generated by the current from current DAC 280 passing through the resistor 282.

The reference signal 284 is changed between an operate point (Bop, the level of a strengthening magnetic field at which the sensor switches on) and a release point (Brp, the level of a weakening magnetic field at which the sensor switches off) by a controller (e.g., controller 132 in FIG. 1) according to the state of the comparator output. The difference between the Bop and Brp reference voltage levels corresponds to the hysteresis of the sensor and permits clean output switching even in the presence of mechanical vibration and electrical noise.

The reference signal 284 can be varied by changing either the amount of current sourced by the DAC 280 or by changing the value of resistor 282. In this way, the reference signal 284 can be set to a predetermined threshold, such as the operate point Bop threshold 290 or the release point Brp threshold 292. As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

The reference signal 284 can be set to Bop or Brp based on the state of the comparator output signal 272, as will be explained. Suffice it to say here that a controller 230 can be coupled to the current DAC 280 in order to set the reference signal level to Bop or Brp based on the state of the comparator output signal 272.

As noted above, samples of the comparator output signal 272 are latched, with each latched sample corresponding to a comparison performed by the comparator. To this end, the comparator 270 can include a latch (i.e., comparator 270 can be a latched comparator) or a separate latch 274 can be provided for coupling to the comparator output as shown by dotted lines. In either case, the comparator output latching is under the control of a clock signal sch_latch 278. In an example embodiment, the output signal 272 of the comparator 270 is latched at each rising edge of the sch_latch pulses and the state of the sensor output signal 232 is updated at the falling edge of the sch_latch pulses.

The latched samples 228 of the comparator output signal 272 provided at the output of the Schmitt trigger circuit 226 are coupled to controller 230 that can be the same as or similar to controller 130 of FIG. 1, and with which an output signal 232 of the sensor can be provided.

During each chopping period, the latched samples 228 of the comparator output signal 272 are evaluated by the controller 230 in order to determine the state of the output signal 232. In an example, if more of the evaluated samples 228 are greater than the threshold signal 284 are less than the threshold signal (i.e., if there are more "1s" than "0s" represented by the latched samples 228), then the output signal 232 is provided at a logic high level; whereas if more of the evaluated samples 228 are less than the threshold signal (i.e., if there are more "0s" than "1s" represented by the latched samples 228), then the output signal 232 is provided at a logic low level).

Figure 3:
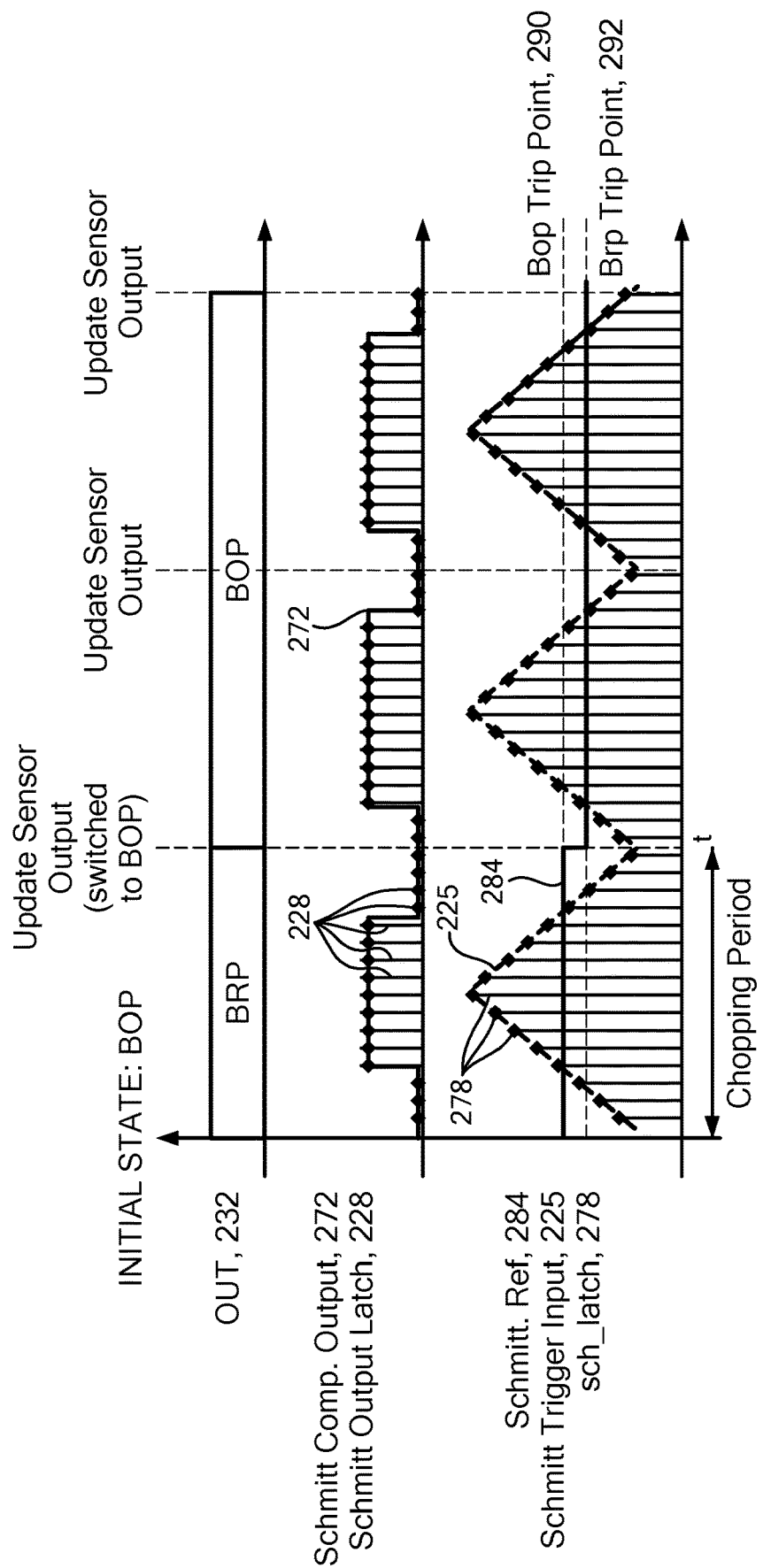
FIG. 3 is shows example signals associated with the sensor of FIG. 2.

Referring also to FIG. 3, example signals associated with the signal path 218 are shown, including latch control signal sch_latch 278 as may be generated by clock logic under the control of controller 230, signal 225 as may be the low pass filtered signal coupled to the first input of the comparator 270, reference signal 284 as may be coupled to the second input of the comparator 270, the resulting comparator output signal 272, and latched samples 228 of the comparator output signal. Also shown is the sensor output signal 232 including an indication of the current state of the output. Specifically, initially the signal 225 is determined to be below the release point Brp (labeled 292 in FIG. 3) and thus, the reference signal 284 is set to look for the next operate point Bop crossing. At a time labeled t, the sensor output signal 232 is updated and the signal 225 is determined to be above the operate point Bop and thus, the reference signal is then set to look for the next release point Brp crossing. In this way, the reference signal 284 has a level based on a state of the comparator output signal.

Considering the labeled chopping period before time t, seven latched comparator output signal samples 228 are below the reference signal 284 (which is set to the Bop reference level 290) and nine samples are above the reference signal. As a result, when the sensor output signal 232 is updated at time t, the signal transitions to a logic high level. During the subsequent chopping period starting at time t, four latched comparator output signal samples 228 are below the reference signal 284 (which is now set to the Brp reference level 292) and twelve samples are above the reference signal. As a result, when the sensor output signal 232 is next updated, it remains at a high logic level, as shown. In this manner, processing the latched signal samples 228 can be considered to be a comparison to the duty cycle of the offset (i.e., within a chopping period) or conversion to a duty cycle.

It will be appreciated by those of ordinary skill in the art that the illustrated sixteen samples per chopping period is an example number of samples and the described concepts are not limited to any particular number of samples per chopping period. In some embodiments, eight or more comparisons and latched comparator output signal samples per chopping period can be used. In general however, the comparator is capable of operating faster than the chopping frequency.

Figure 4:
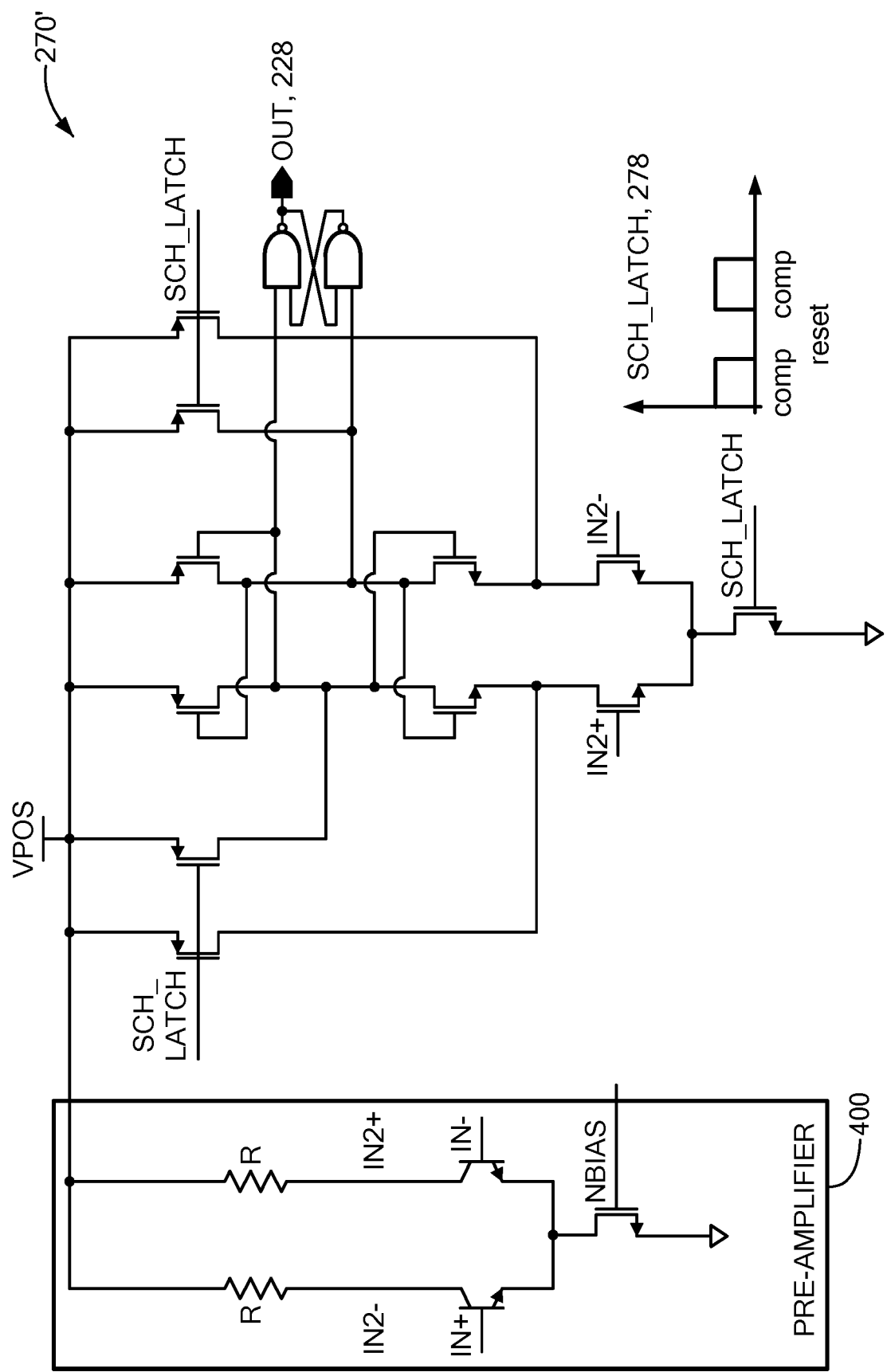
FIG. 4 is a schematic of the high speed comparator of the sensor of FIG. 2.

Referring to FIG. 4, an example high speed comparator 270' is shown. Comparator 270' can be used in the Schmitt trigger circuit 226 described above and can include a pre-amplifier 400.

Comparator 270' has a first non-inverting input IN2+ that can be coupled to the pre-amplifier 400, a second inverting input IN2− that can be coupled to the pre-amplifier 400, and an output at which the latched comparator output samples 228 can be provided. The latch clock signal sch_latch 278 controls operation of the comparator 270' and in an example, causes the comparator output signal samples to be latched when at a logic high level and resets the comparator (i.e., bring the comparator nodes to a defined state) when at a logic low level.

Pre-amplifier 400 includes differential inputs labeled IN−, IN+ and is provided to reduce or eliminate input offset otherwise associated with the comparator 270'. Pre-amplifier inputs IN+, IN− can be coupled to receive the low pass filtered signal 225 and NBIAS can be a voltage reference that sets the current of the pre-amplifier 400. It will be appreciated by those of ordinary skill in the art that the illustrated comparator 270' including pre-amplifier 400 is an example and the comparator is not limited to the any particular topology.

Figure 5:
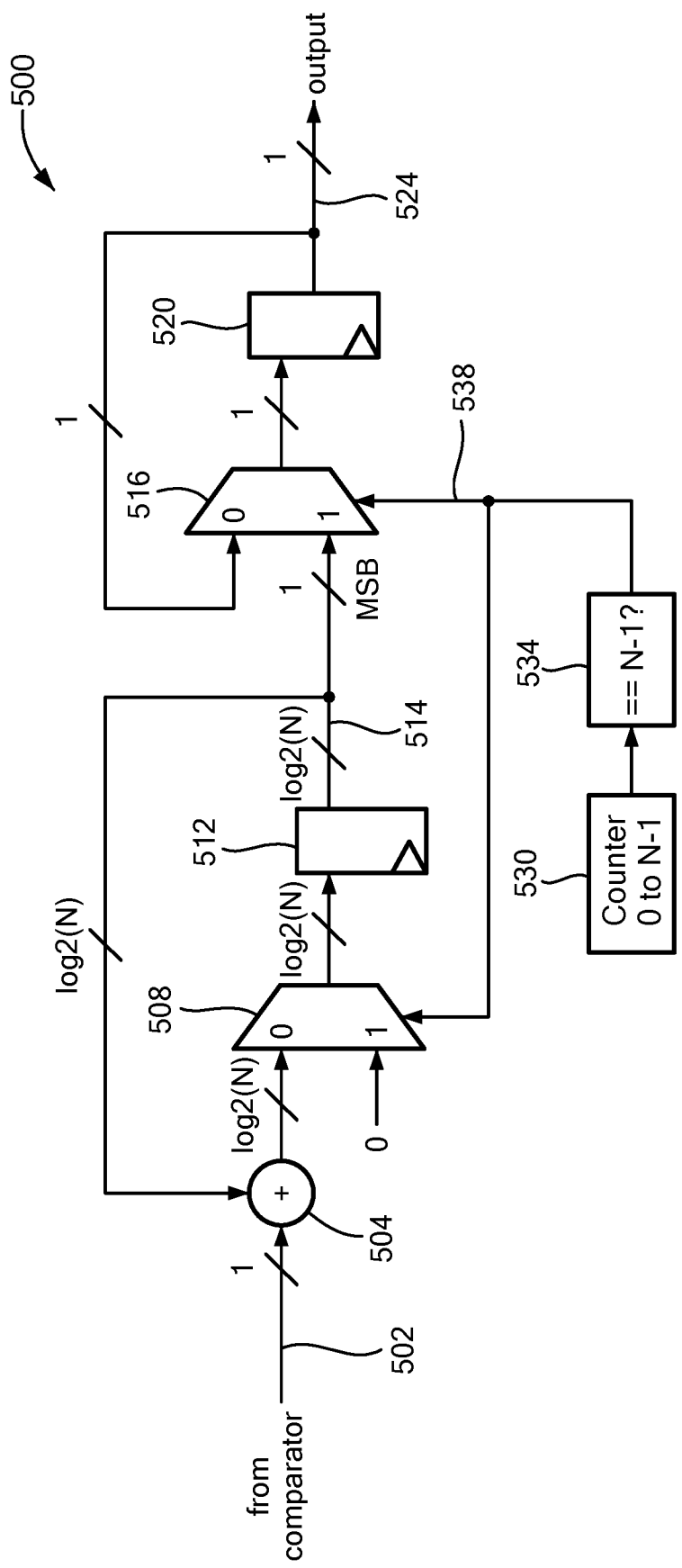
FIG. 5 is a schematic of an example portion of the controller of the sensor of FIG. 2.

FIG. 5 shows an example portion 500 of controller 230 and memory with which the sensor output signal 232 can be generated. In particular, FIG. 5 illustrates a so-called "accumulate and dump" methodology to the processing of latched samples 228 from the comparator output 272. To this end, circuit 500 includes a summation element 504 coupled to receive an input signal 502 (that can be the latched comparator output samples 228), multiplexers 508, 516, registers 512, 520, and a counter 530 and decision block 534.

In operation, circuit 500 accumulates the values of N consecutive latched comparator output samples 502. In an embodiment, N can be a power of two for simplicity (i.e., $2^k=N$). Once N sample values are accumulated, control signal 538 causes the most significant bit of the accumulated value to be provided as the output signal 524.

Figure 5A:
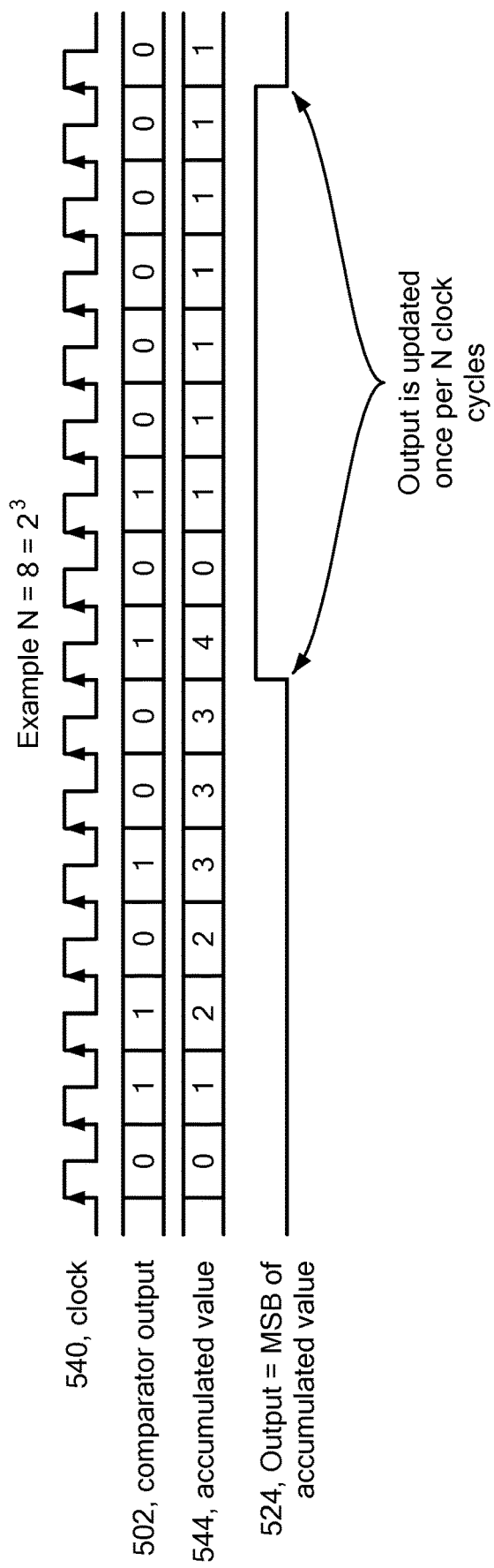
FIG. 5A shows example signals associated with the controller portion of FIG. 5.

Referring to FIG. 5A, example waveforms associated with the controller portion 500 include a clock signal 540, latched comparator output samples 502, the accumulated value 544 of the samples, and the output signal 524 as the most significant bit of the accumulated value. As illustrated, the output signal 524 is updated once per N clock cycles.

Figure 6:
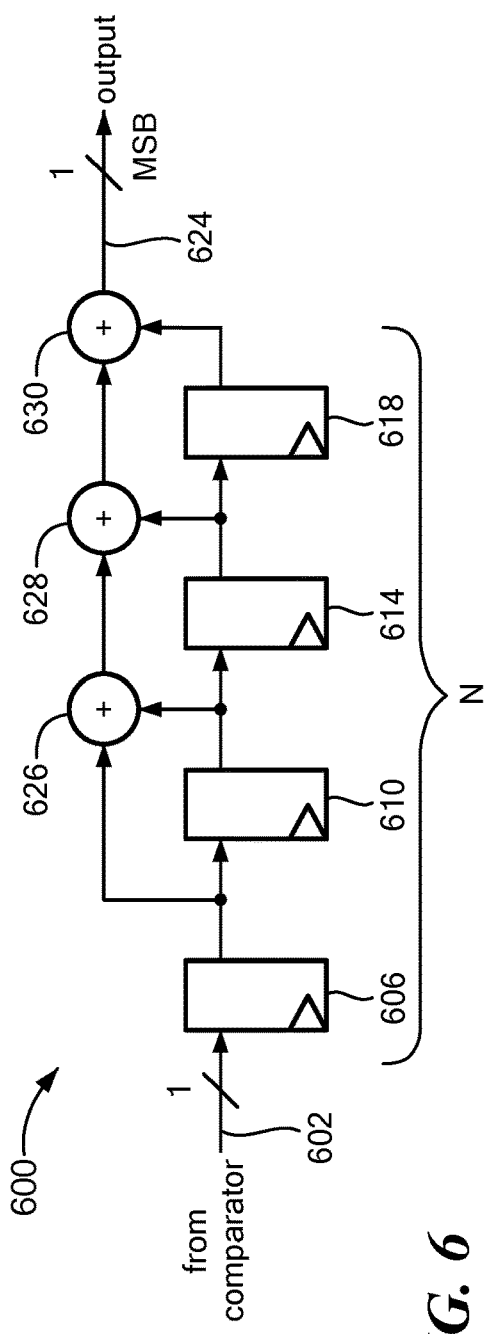
FIG. 6 is a schematic of another example portion of the controller of the sensor of FIG. 2.

FIG. 6 shows an alternative example portion 600 of controller 230 and memory with which the sensor output signal 232 can be generated. In particular, FIG. 6 illustrates a continuous addition methodology to the processing of latched samples 228 of the comparator output 272 signal. To this end, circuit 600 includes series coupled, first in first out (FIFO) shift registers 606, 610, 614, and 618, a first one of which 606 is coupled receive an input signal 602 (that can be the latched comparator output samples 228). Series coupled summation elements 616, 628, 630 are coupled as shown to continuously sum N consecutive samples 602. An output of the last, Nth summation element 630 provides the output signal 624.

In operation, circuit 600 continuously sums the values of N consecutive latched comparator output samples 602. In an embodiment, N can be a power of two for simplicity (i.e., $2^k=N$). The most significant bit of the N summed values is provided as the output signal 624.

Figure 6A:
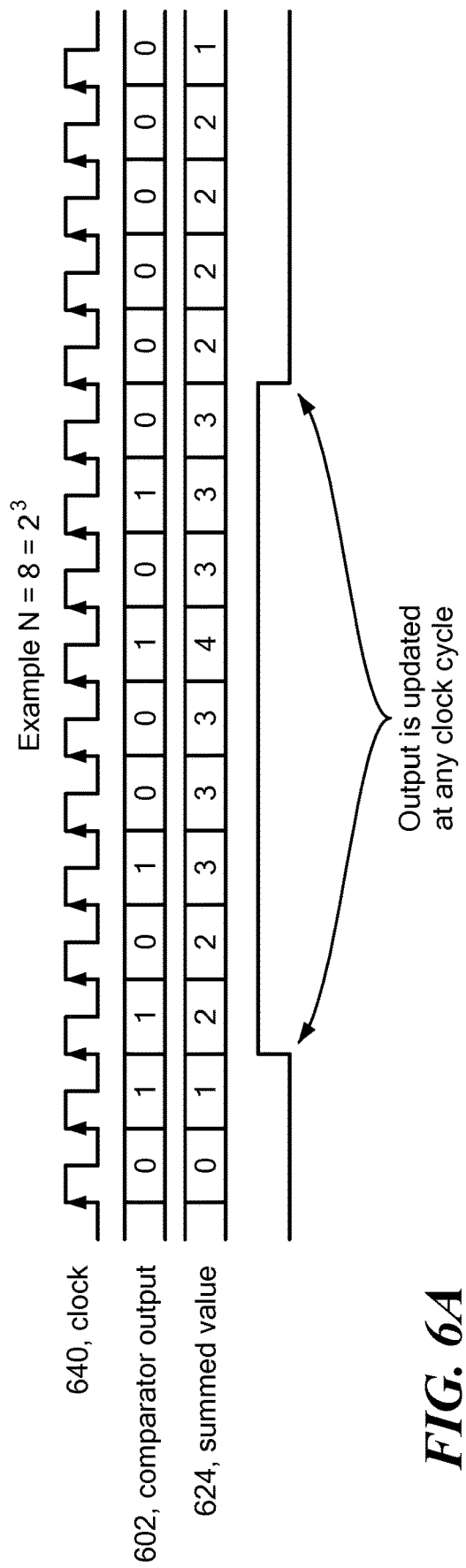
FIG. 6A illustrates shows example signals associated with the controller portion of FIG. 6.

Referring to FIG. 6A, example waveforms associated with the controller portion 600 include a clock signal 640, latched comparator output samples 602, and the output signal 624 as the most significant bit of the accumulated value. As illustrated, the output signal 624 can be updated at any clock cycle. This is because at any given time, the value 624 represents the summation of the last N signal sample values.

The circuitry and techniques described in connection with FIGS. 5, 5A, 6 and 6A advantageously permit signal sample processing in a manner that reduces or eliminates jitter that can otherwise be associated with sample processing. However, it will be appreciated by those of ordinary skill in the art that the circuitry and techniques described in connection with FIGS. 5, 5A, 6 and 6A are examples and use of the concepts described herein are not limited to any particular processing methodology for evaluating latched samples of the comparator output signal in order to generate and update the sensor output signal.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A magnetic field sensor comprising:
   a magnetic field sensing elements configured to generate a magnetic field signal indicative of a sensed magnetic field;
   a modulator configured to modulate the magnetic field signal at a chopping frequency;
   a front end amplifier coupled to receive the magnetic field signal and generate an amplified signal;
   a demodulator configured to demodulate the amplified signal at the chopping frequency;
   a low pass filter configured to process the amplified signal and generate a low pass filtered signal; and
   a Schmitt trigger circuit comprising a comparator having a first input coupled to receive the low pass filtered signal, a second input coupled to receive a reference signal, and an output at which a comparator output signal is provided, wherein the comparator is configured to perform a plurality of comparisons of the low pass filtered signal to the reference signal within a chopping time period, wherein the chopping time period is the inverse of the chopping frequency.

2. The magnetic field sensor of claim 1, wherein the Schmitt trigger circuit has an output at which samples of the comparator output signal are latched, wherein each sample of the comparator output signal corresponds to a comparison performed by the comparator.

3. The magnetic field sensor of claim 2, wherein the Schmitt trigger circuit comprises a latch having an input coupled to the output of the comparator, a control input, and an output at which the samples of the comparator output signal are provided.

4. The magnetic field sensor of claim 2, wherein the comparator comprises a latch configured to provide the samples of the comparator output signal.

5. The magnetic field sensor of claim 4, wherein the comparator further comprises a pre-amplifier coupled to receive the low pass filtered signal.

6. The magnetic field sensor of claim 2, further comprising:
a shift register configured to store a plurality of samples of the comparator output signal; and
a controller coupled to the shift register and configured to determine whether the stored samples of the comparator output signal exceed the reference signal and generate an output of the magnetic field sensor based on the determination.

7. The magnetic field sensor of claim 6, wherein the controller is configured to accumulate values of the stored samples of the comparator output signal to determine an accumulated value and generate the magnetic field sensor output signal based on a most significant bit of the accumulated value.

8. The magnetic field sensor of claim 6, wherein the controller is configured to continuously determine a summation of values of the stored samples of the comparator output signal and generate the magnetic field sensor output signal based on a most significant bit of the summation.

9. The magnetic field sensor of claim 1, wherein the plurality of comparisons comprises at least eight comparisons.

10. The magnetic field sensor of claim 1, wherein the reference signal has a level based on a state of the comparator output signal.

11. The magnetic field sensor of claim 1, further comprising a digital-to-analog converter (DAC) coupled to a variable resistor and configured to generate the reference signal.

12. A method for processing a magnetic field signal with a magnetic field sensor, comprising:
generating, with a magnetic field sensing element, the magnetic field signal in response to a magnetic field;
modulating the magnetic field signal at a chopping frequency;
amplifying, with a front end amplifier, the magnetic field signal to generate an amplified signal;
demodulating the amplified signal at the chopping frequency;
filtering the amplified signal with a low pass filter to generate a low pass filtered signal; and
comparing, with a Schmitt trigger circuit, the low pass filtered signal to a reference signal a plurality of times within a chopping time period to generate a comparison signal, wherein the chopping time period is the inverse of the chopping frequency.

13. The method of claim 12, further comprising latching samples of the comparison signal.

14. The method of claim 13, further comprising accumulating values of the latched samples of the comparison signal to generate an accumulated value and providing an output signal of the magnetic field sensor based on a most significant bit of the accumulated value.

15. The method of claim 13, further comprising continuously summing values of the latched samples and providing an output signal of the magnetic field sensor based on a most significant bit of the summation.

16. The method of claim 12, further comprising generating the reference signal based on a state of the comparison signal.

17. A magnetic field sensor comprising:
a magnetic field sensing elements configured to generate a magnetic field signal indicative of a sensed magnetic field;
a modulator configured to modulate the magnetic field signal at a chopping frequency;
a front end amplifier coupled to receive the magnetic field signal and generate an amplified signal;
a demodulator configured to demodulate the amplified signal at the chopping frequency;
a low pass filter configured to process the amplified signal and generate a low pass filtered signal; and
means for performing a plurality of comparisons of the low pass filtered signal with a reference signal during a chopping time period, wherein the chopping time period is the inverse of the chopping frequency.

18. The magnetic field sensor of claim 17, further comprising means for generating an output signal of the magnetic field sensor based on the comparisons.

19. The magnetic field sensor of claim 18, further comprising means for generating the reference signal based on a state of the output signal.

* * * * *

UNITED STATES PATENT AND TRADEMARK OFFICE
CERTIFICATE OF CORRECTION

PATENT NO. : 11,892,524 B1
APPLICATION NO. : 18/046203
DATED : February 6, 2024
INVENTOR(S) : Ezequiel Rubinsztain et al.

Page 1 of 1

It is certified that error appears in the above-identified patent and that said Letters Patent is hereby corrected as shown below:

In the Specification

Column 1, Line 30 delete "of a" and replace with --of--.

Column 3, Line 39 delete "FIG. 3 is shows" and replace with --FIG. 3 shows--.

Column 3, Line 49 delete "illustrates shows" and replace with --illustrates--.

Column 7, Line 30 delete "R1$fp$" and replace with --R1$pf$--.

Column 7, Line 52 delete "132" and replace with --130--.

Column 8, Lines 31-32 delete "284 are less than the threshold signal (i.e.," and replace with --284 (i.e.,--.

Column 8, Line 38 delete "level)." and replace with --level.--.

Column 9, Line 28 delete "bring" and replace with --brings--.

Column 9, Line 53 delete "significative" and replace with --significant--.

Column 9, Line 65 delete "272 signal." and replace with --signal 272.--.

Column 10, Line 1 delete "coupled receive" and replace with --coupled to receive--.

Column 10, Line 3 delete "616," and replace with --626,--.

Column 10, Line 10 delete "significative" and replace with --significant--.

Signed and Sealed this
Twenty-second Day of October, 2024

Katherine Kelly Vidal
*Director of the United States Patent and Trademark Office*